(12) United States Patent
Liu et al.

(10) Patent No.: US 11,716,822 B2
(45) Date of Patent: Aug. 1, 2023

(54) DISPLAY MODULE, DISPLAY DEVICE AND ASSEMBLING METHOD OF DISPLAY MODULE

(71) Applicants: K-TRONICS (SUZHOU) TECHNOLOGY CO., LTD., Jiangsu (CN); BOE TECHNOLOGY GROUP CO., LTD., Beijing (CN)

(72) Inventors: Hao Liu, Beijing (CN); Lihua Sheng, Beijing (CN); Yunben Shen, Beijing (CN); Yefei Ma, Beijing (CN)

(73) Assignees: K-TRONICS (SUZHOU) TECHNOLOGY CO., LTD., Jiangsu (CN); BOE TECHNOLOGY GROUP CO., LTD., Beijing (CN)

( * ) Notice: Subject to any disclaimer, the term of this patent is extended or adjusted under 35 U.S.C. 154(b) by 402 days.

(21) Appl. No.: 17/040,878

(22) PCT Filed: Nov. 25, 2019

(86) PCT No.: PCT/CN2019/120641
§ 371 (c)(1),
(2) Date: Sep. 23, 2020

(87) PCT Pub. No.: WO2021/102635
PCT Pub. Date: Jun. 3, 2021

(65) Prior Publication Data
US 2022/0330443 A1    Oct. 13, 2022

(51) Int. Cl.
*H05K 5/02*    (2006.01)
*H05K 5/00*    (2006.01)

(52) U.S. Cl.
CPC ......... *H05K 5/0217* (2013.01); *H05K 5/0017* (2013.01)

(58) Field of Classification Search
USPC ........................................ 361/807, 809, 810
See application file for complete search history.

(56) References Cited

U.S. PATENT DOCUMENTS

| | | | | |
|---|---|---|---|---|
| 2008/0060244 A1* | 3/2008 | Yang | ..................... | G06F 1/1601 |
| | | | | 40/716 |
| 2011/0292315 A1* | 12/2011 | Bae | ................... | G02F 1/133308 |
| | | | | 362/606 |

(Continued)

FOREIGN PATENT DOCUMENTS

| | | |
|---|---|---|
| CN | 202043218 U | 11/2011 |
| CN | 106454174 A | 2/2017 |

(Continued)

*Primary Examiner* — Hung S. Bui
(74) *Attorney, Agent, or Firm* — Dinsmore & Shohl LLP

(57) ABSTRACT

The present disclosure relates to a display module, a display device, and an assembling method of the display module. The display module includes: a display panel; a backplane disposed on one side of the display panel away from a light emitting surface of the display panel; a reflective sheet disposed between the display panel and the backplane; and an adapter bracket disposed between the reflective sheet and the backplane, and configured to connect with an external support structure located outside the display module, wherein the adapter bracket has a first surface and a second surface, the first surface is fixed on a surface of the backplane adjacent to the display panel in a surface contact manner, and the second surface supports the reflective sheet.

12 Claims, 5 Drawing Sheets

(56) References Cited

U.S. PATENT DOCUMENTS

| | | | |
|---|---|---|---|
| 2015/0098026 A1* | 4/2015 | Kasai | G02B 6/0091 |
| | | | 348/794 |
| 2015/0212261 A1* | 7/2015 | Masuda | H04N 5/645 |
| | | | 348/794 |
| 2015/0219954 A1* | 8/2015 | Kubo | G02B 6/0088 |
| | | | 349/60 |
| 2017/0146727 A1* | 5/2017 | Kuroyanagi | G02F 1/133308 |

FOREIGN PATENT DOCUMENTS

| | | |
|---|---|---|
| CN | 206001239 U | 3/2017 |
| CN | 110493547 A | 11/2019 |
| EP | 2592465 A2 | 5/2013 |

* cited by examiner

DISPLAY MODULE, DISPLAY DEVICE AND ASSEMBLING METHOD OF DISPLAY MODULE

CROSS-REFERENCE TO RELATED APPLICATIONS

The present application is a U.S. National Stage Application under 35 U.S.C. § 371 of International Patent Application No. PCT/CN2019/120641, filed on Nov. 25, 2019, the disclosure of which is incorporated by reference herein in its entirety.

TECHNICAL FIELD

The present disclosure relates to a display module, a display device, and an assembling method of the display module.

BACKGROUND

With the development of display technology, large-sized display devices (such as televisions or displays) have been widely applied. In order to meet the requirements for wall mounting and placing such display devices, in some related arts, the base adapter bracket is assembled outside an entire display device.

SUMMARY

In one aspect of the present disclosure, a display module is provided. The display module includes: a display panel; a backplane disposed on one side of the display panel away from a light emitting surface of the display panel; a reflective sheet disposed between the display panel and the backplane; and an adapter bracket disposed between the reflective sheet and the backplane, and configured to connect with an external support structure located outside the display module, wherein the adapter bracket has a first surface and a second surface, the first surface is fixed on a surface of the backplane adjacent to the display panel in a surface contact manner, and the second surface supports the reflective sheet.

In some embodiments, the backplane has a first edge extending along a first direction and a second edge extending along a second direction, and the adapter bracket is located inside a corner where the first edge intersects with the second edge.

In some embodiments, the adapter bracket includes: a first bracket body arranged adjacent to the first edge along the first direction; and a plurality of mounting grooves located on one side of the first bracket body adjacent to the display panel, wherein the external support structure includes a wall mount bracket on one side of the backplane away from the display panel, and the display module further includes: a plurality of magnetic bodies respectively arranged within the plurality of mounting grooves along the first direction, and configured to absorb the wall mount bracket by a magnetic force.

In some embodiments, the adapter bracket further includes: a plurality of first reinforcing ribs located on a surface of the first bracket body and extending along the first direction; and a plurality of second reinforcing ribs located on a surface of the first bracket body and extending along the second direction, wherein the plurality of second reinforcing ribs and the plurality of first reinforcing ribs are crossed and connected with each other, and form the plurality of mounting grooves, and the second surface includes end surfaces of the plurality of second reinforcing ribs on one side adjacent to the display module and end surfaces of the plurality of first reinforcing ribs on one side adjacent to the display module, wherein the end surfaces of the plurality of second reinforcing ribs on one side adjacent to the display module and the end surfaces of the plurality of first reinforcing ribs on one side adjacent to the display module are all located in a same plane which forms an acute angle with a surface of the backplane along the second direction.

In some embodiments, the adapter bracket further includes: a second bracket body connected to the first bracket body and arranged adjacent to the second edge along the second direction; wherein an end surface of the second bracket body away from the first bracket body has a hook groove for hooking the wall mount bracket.

In some embodiments, the adapter bracket includes: a second bracket body arranged adjacent to the second edge along the second direction, wherein the external support structure includes a bottom support seat, and an end surface of the second bracket body adjacent to the second edge has at least two mounting holes for connecting with the bottom support seat, and the at least two mounting holes are arranged at intervals along the second direction.

In some embodiments, the adapter bracket further includes: a plurality of third reinforcing ribs located on a surface of the second bracket body and extending along the first direction; wherein at least part of the plurality of third reinforcing ribs are respectively located between every two adjacent mounting holes among the at least two mounting holes.

In some embodiments, the at least two mounting holes are three mounting holes, and connection lines between the three mounting holes form an obtuse triangle.

In some embodiments, further comprising a first edge frame disposed at the first edge of the backplane, wherein the adapter bracket further includes: a limiting block disposed on the first bracket body and protruding towards a direction approaching the first edge relative to the first bracket body along the second direction, and wherein the limiting block is clamped with the first edge frame so as to define a relative position of the adapter bracket and the first edge frame.

In some embodiments, the first direction is perpendicular to the second direction.

In some embodiments, the display module further comprises: a first edge frame located at the first edge of the backplane; and a second edge frame located at the second edge of the backplane; wherein the adapter bracket further includes: a plurality of first reinforcing ribs located on a surface of the first bracket body and extending along the first direction; a plurality of second reinforcing ribs located on a surface of the first bracket body and extending along the second direction perpendicular to the first direction; and a limiting block disposed on the first bracket body and protruding towards a direction approaching the first edge relative to the first bracket body along the second direction wherein the limiting block is clamped with the first edge frame so as to define a relative position of the adapter bracket and the first edge frame, wherein the second bracket body is connected to the first bracket body, and an end surface of the second bracket body away from the first bracket body has a hook groove for hooking the wall mount bracket.

In some embodiments, the display module further includes: an optical film layer located between the display panel and the reflective sheet; and a printed circuit board holder located between the reflective sheet and the backplane, and arranged adjacent to the second edge frame.

In another aspect of the present disclosure, a display device is provided. The display device includes the foregoing display module.

In another aspect of the present disclosure, an assembling method of a display module is provided. The method includes: providing a backplane; mounting an adapter bracket on one side of the backplane, and fixing a first surface of the adapter bracket on a surface of the backplane in a surface contact manner; mounting a reflective sheet and a display panel on one side of the adapter bracket away from the backplane, so that the reflective sheet is located between the display panel and the backplane, and supported by a second surface of the adapter bracket, and a light emitting surface of the display panel is located on one side of the display panel away from the adapter bracket.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
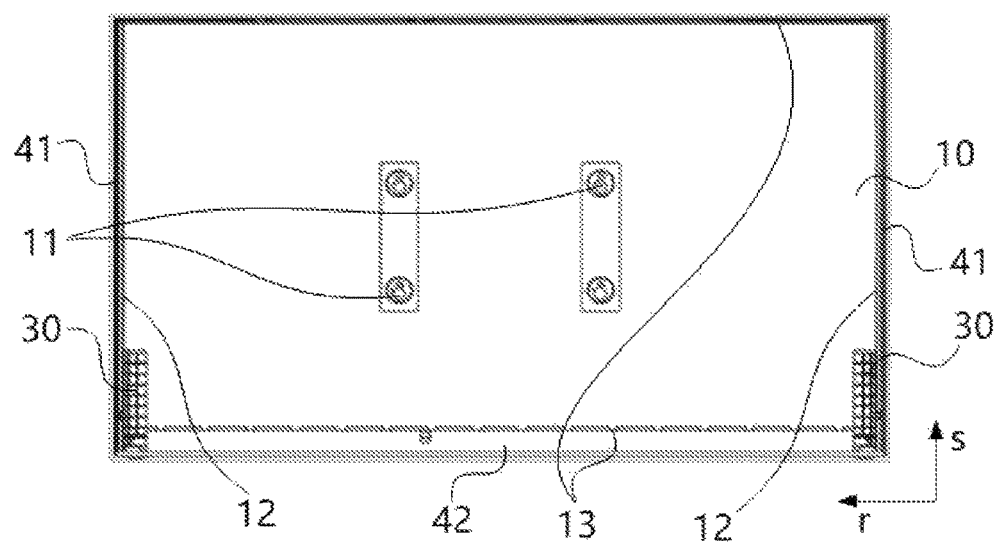
FIG. 1 is a schematic view of an assembled structure of a backplane, an adapter bracket, a first edge frame, and a second edge frame in a forward viewing angle in an embodiment of the display module according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. Such similar words as "comprising" or "containing" mean that the element preceding the word encompasses the elements enumerated after the word, and does not exclude the possibility of encompassing other elements as well. The terms "up", "down", "left", "right", or the like are only used to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as a part of this specification.

In some related technologies, the base adapter bracket is assembled outside the entire display device. The base adapter bracket occupies a large space, and can only achieve the overall support function of the display device.

In view of this, the embodiments of the present disclosure provide a display module, a display device, and an assembling method of the display module, which can reduce space occupation of the adapter bracket.

Figure 2:
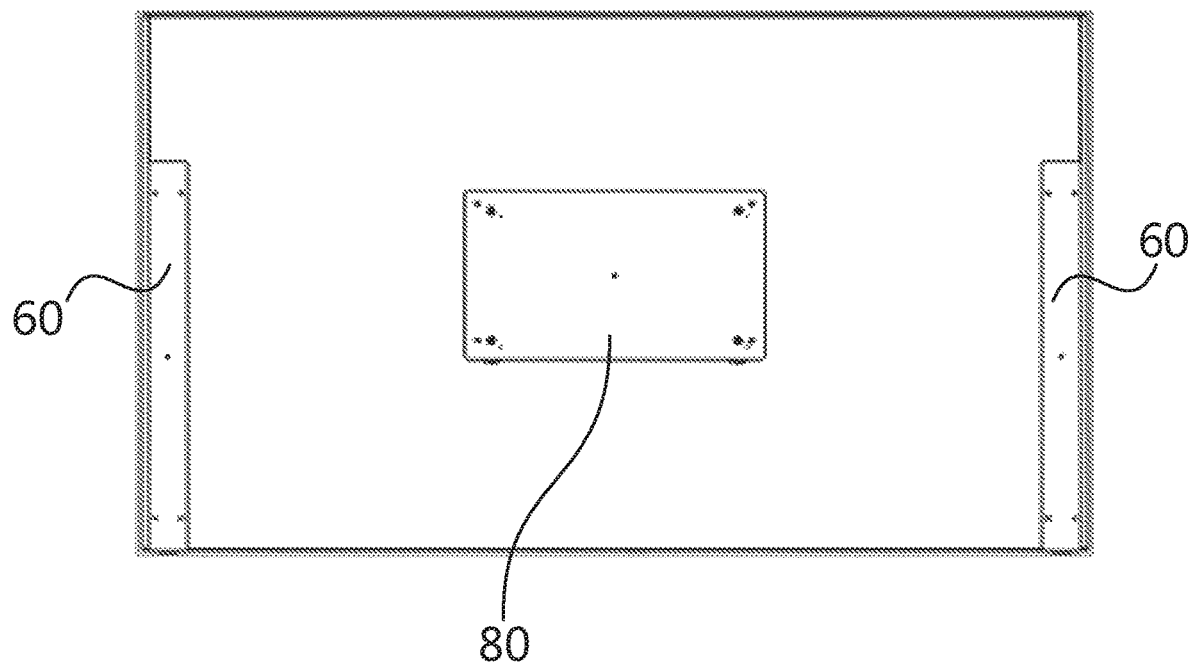
FIG. 2 is a schematic view of a wall mount structure corresponding to an embodiment of the display module according to the present disclosure.
Figure 3:
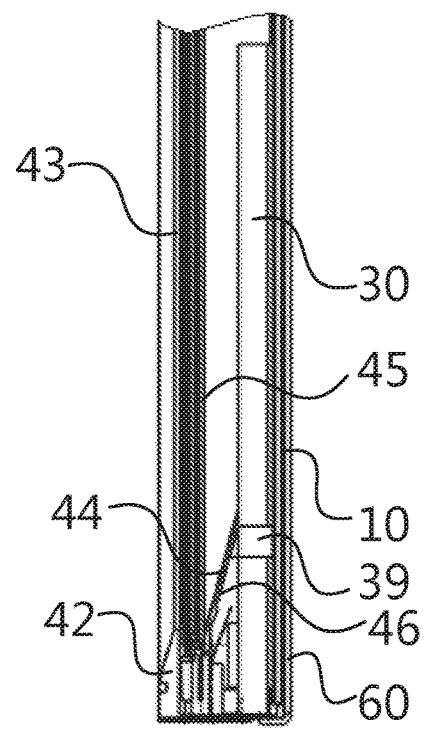
FIG. 3 is a schematic view of an assembled structure in an embodiment of the display module according to the present disclosure from a lateral perspective, in which a first edge frame is removed from the assembled structure.
Figure 6:
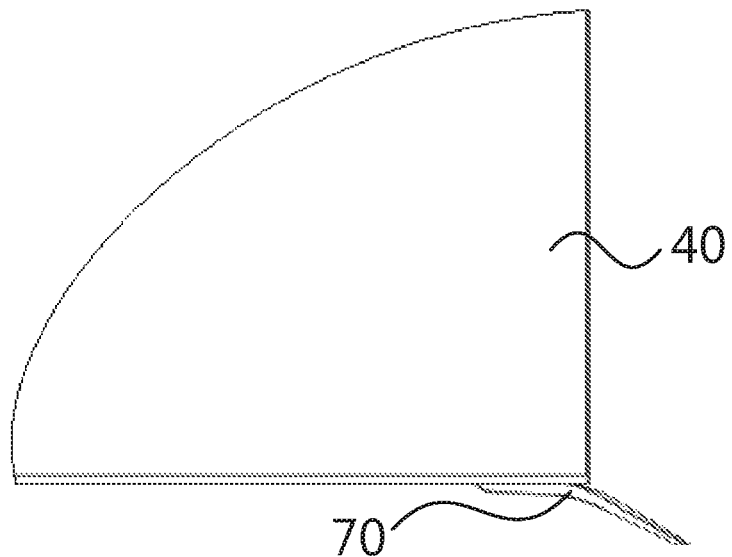
FIGS. 6 and 7 are partial schematic views of an assembled structure in an embodiment of the display module according to the present disclosure and a bottom support seat in a forward viewing angle and a bottom viewing angle respectively.
Figure 7:
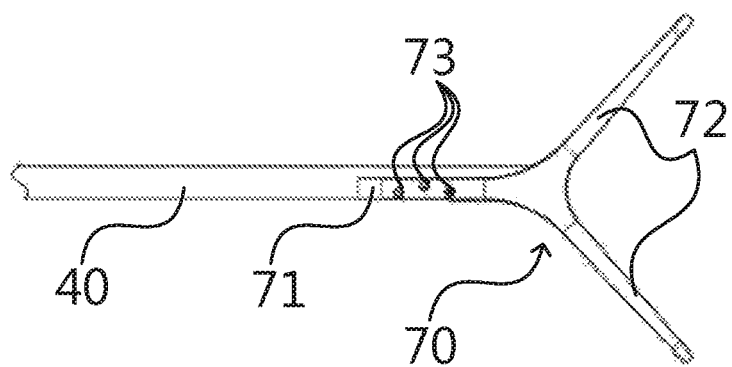

FIG. 1 is a schematic view of an assembled structure of a backplane, an adapter bracket, a first edge frame, and a second edge frame in a forward viewing angle in an embodiment of the display module according to the present disclosure. FIG. 2 is a schematic view of a wall mount structure corresponding to an embodiment of the display module according to the present disclosure. FIG. 3 is a schematic view of an assembled structure in an embodiment of the display module according to the present disclosure from a lateral perspective, in which a first edge frame is removed from the assembled structure. FIGS. 6 and 7 are partial schematic views of an assembled structure in an embodiment of the display module according to the present disclosure and a bottom support seat in a forward viewing angle and a bottom viewing angle respectively.

Referring to FIGS. 1-3 and 6-7, in some embodiments, the display module includes: a display module 40, including: a display panel 43, a backplane 10, and an adapter bracket 30. In some embodiments, the display panel 43 is a liquid crystal display panel. In other embodiments, the display panel 43 is an organic light-emitting diode (OLED) display panel, a mini-LED display panel or a micro light-emitting diode (Micro-LED) display panel, and the like.

The backplane 10 is disposed on one side of the display panel 43 away from a light emitting surface of the display panel 43. The backplane 10 may be made of glass material, or other materials such as metal, alloy, or ceramic. The adapter bracket 30 is disposed between the display panel 43 and the backplane 10, and may be connected to an external support structure located outside the display module 40. The adapter bracket 30 may be made of metal so as to obtain better structural strength and rigidity. In other embodiments, other materials may also be used, such as glass, metal, or ceramics.

In the present embodiment, the adapter bracket is disposed between the backplane and the display panel as a component of the display module, and connected to an external support structure of the display module, so that on one hand, the adapter bracket may occupy less assembling space, and on the other hand, the adapter bracket within the display module can achieve a more reliable supporting effect. In addition, compared to a manner in which the base adapter bracket is mounted outside the entire display device in the related art, the present embodiment may omit the installation of an external adapter bracket of the entire display device, thereby saving the related labor cost.

Referring to FIGS. 1 and 3, in some embodiments, the adapter bracket 30 has a first surface and a second surface, wherein the first surface is fixed on a surface of the backplane 10 adjacent to the display panel 43 in a surface contact manner. For example, a flat surface having a large area can be formed on one side of the adapter bracket 30 adjacent to the backplane. During assembling, the flat surface of the adapter bracket 30 may be closely attached to a surface of the backplane 10 and fixed in an adhesive manner. An adhesive such as two-liquid mixed curable glue may be used for adhesion. In other embodiments, the backplane may also include an arc surface, and the adapter bracket 30 is also in contact and fixed with a surface of the backplane through the arc-shaped surface. The second surface of the adapter bracket 30 may support other components inside the display module, such as reflective sheet in the display module.

In the present embodiment, the adapter bracket is provided between the backplane and the display panel as a component of the display module, and connected to an external support structure of the display module. In this way, on one hand, the adapter bracket may occupy less assembling space, and on the other hand, a more reliable supporting effect from outside and inside is achieved by the adapter bracket within the display module. In addition, compared to a manner in which the base adapter bracket is mounted outside the entire display device in the related art, the present embodiment may omit the installation of an external adapter bracket of the entire display device, thereby saving the related labor cost.

Referring to FIG. 1, in some embodiments, the backplane 10 can have a first edge extending along a first direction s and a second edge extending along a second direction r. The adapter bracket 30 is located inside a corner where the first edge intersects with the second edge. The first direction s and the second direction r may form a predetermined included angle with each other, for example, at an included angle of 90 degrees. That is, the first direction s is perpendicular to the second direction r, so that a right-angled corner may be formed.

In FIG. 1, the backplane 10 which has a rectangular shape as a whole has first edges 12 located on the left and right sides and second edges 13 located on the upper and lower sides, wherein the first edges 12 located on the left and right sides respectively form left and right corners with the second edges 13 located on the lower side. The display module 40 may include two adapter brackets 30, which are respectively disposed on the inner sides of the left and right corners at a lower portion of the backplane. In other embodiments, two adapter brackets 30 may also be provided at two corners formed by the second edge 13 on the upper side and the first edges 12 on the left and right sides respectively, for connecting with the external support structure.

In FIG. 1, the display module 40 may further include a first edge frame 41 and a second edge frame 42. The first edge frame 41 may be disposed at the first edge of the backplane 10, and may position and protect the backplane 10, the adapter bracket 30, the display panel 43, and other structures between the backplane 10 and the display panel 43 on the left and right sides of the display module. The second edge frame 42 may be disposed at the second edge of the backplane 10, and may position and protect the backplane 10, the adapter bracket 30, the display panel 43, and other structures between the backplane 10 and the display panel 43 on the lower and front sides of the display module.

Referring to FIG. 3, in some embodiments, the display module 40 may further include other structures between the display panel 43 and the backplane 10. For example, when a liquid crystal display panel is used as the display panel 43, the display module 40 may further include devices for implementing backlight, such as reflective sheet 44, light bar, optical film layer 45, and printed circuit board (PCB) holder 46 and the like. The reflective sheet 44 which is located between the adapter bracket 30 and the display panel 43, and supported by the adapter bracket 30, may realize the function of a bottom reflective layer. The light bar may be located at an outer edge of a flat surface of the optical film layer 45 to provide the optical film layer with a side-type light source. The optical film layer 45 is located between the display panel 43 and the reflective sheet 44, and may realize functions such as light guiding, light homogenizing, and light focusing as required. The PCB holder 46 is located between the reflective sheet 44 and the backplane 10, arranged adjacent to the second edge frame 42, and may be configured to hold the PCB of the display module 40.

Figure 4A:
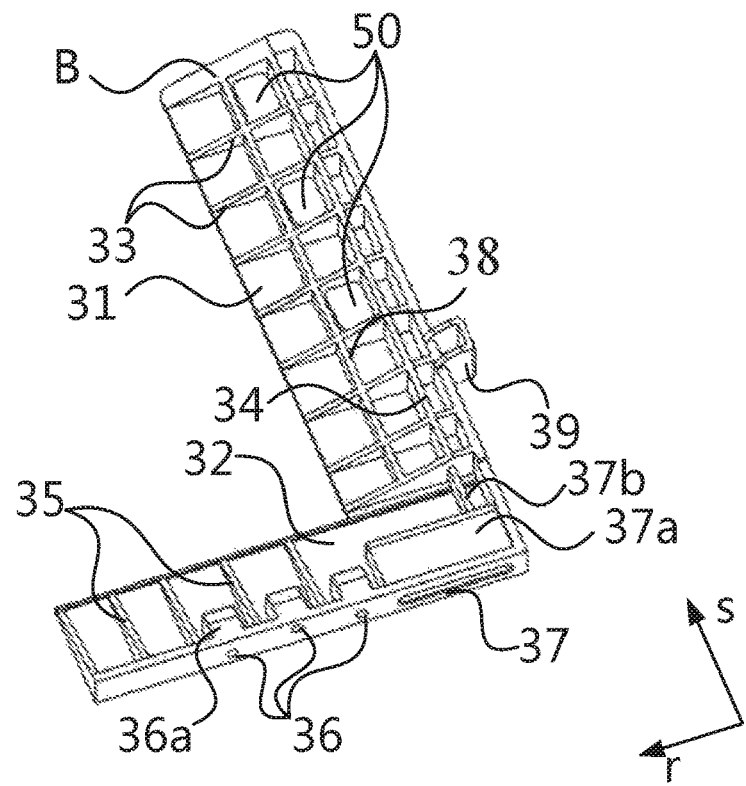
FIGS. 4A and 4B are respectively three-dimensional structural schematic views of the adapter bracket in an embodiment of the display module according to the present disclosure from a front side viewing angle and a rear side viewing angle.
Figure 4B:
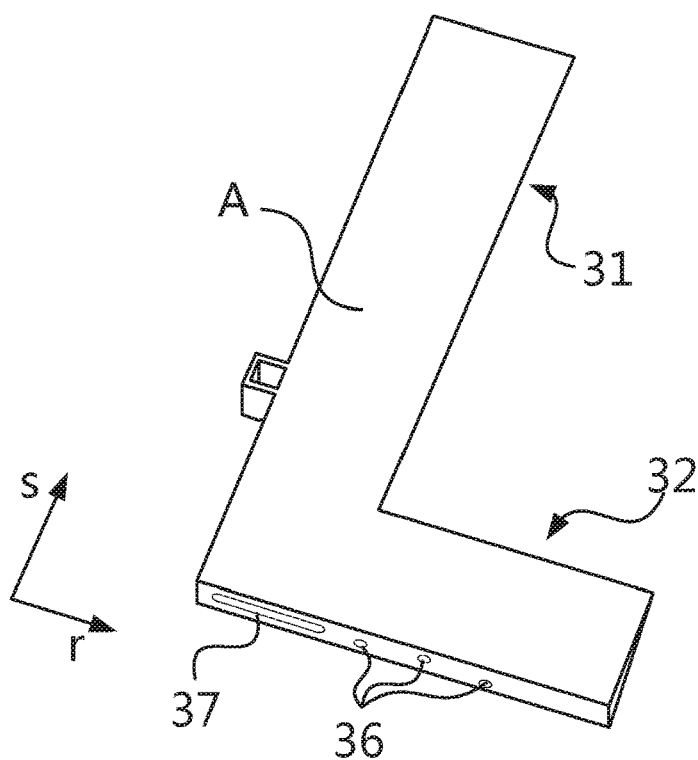
Figure 5A:
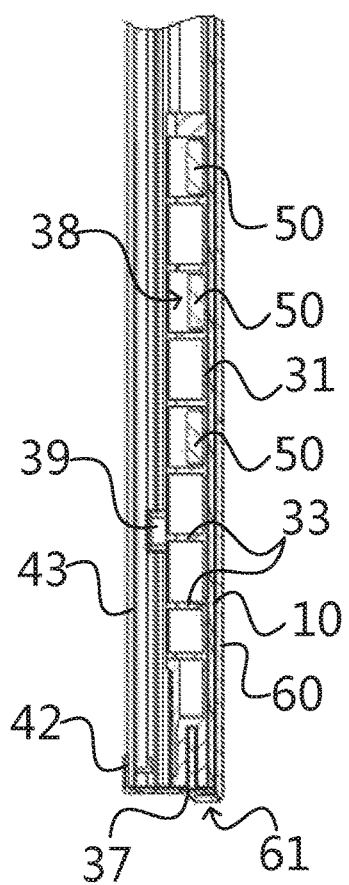
FIG. 5A is a schematic view of a cross-section of an assembled structure parallel to a first direction and perpendicular to the backplane in an embodiment of the display module according to the present disclosure.
Figure 5B:
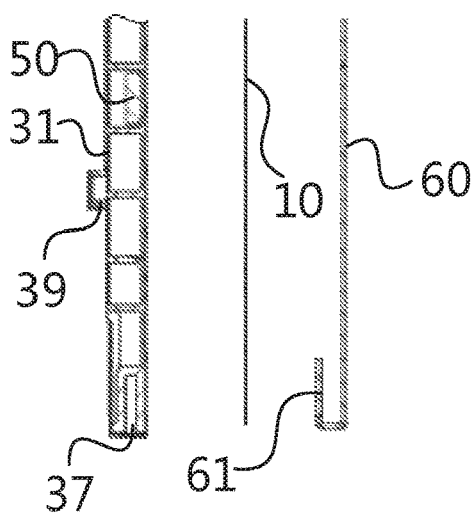
FIG. 5B is an exploded schematic view of a partial cross-sectional structure of FIG. 5A.

FIG. 4A and FIG. 4B are schematic perspective structural views of the front view and the rear view of the adapter bracket according to an embodiment of the display module of the present disclosure. FIG. 5A is a schematic view of a cross-section of an assembled structure parallel to a first direction and perpendicular to a backplane an embodiment of a display module according to the present disclosure. FIG. 5B is an exploded schematic view of the partial cross-sectional structure of FIG. 5A. FIGS. 6 and 7 are partial schematic views of an assembled structure in an embodiment of a display module according to the present disclosure and a bottom support seat in a forward viewing angle and a bottom viewing angle respectively.

Referring to FIG. 2, the external support structure on one side of the backplane 10 away from the display panel 43 may include a wall mount bracketed structure. The wall mount structure may include a hook plate 80 corresponding to a middle of the backplane 10 and wall mount brackets 60 on the left and right sides of the hook plate 80. The hook plate 80 may be provided with a plurality of connecting holes for fixing connecting pieces for hooking, such as screws and the like. To be fit therewith, a plurality of hook holes 11 for hooking the connecting piece may also be provided in the middle of the backplane 10 in FIG. 1. The cross-sectional shapes of the hook holes 11 may be set to two circles having intersecting boundaries, and the diameter of the circle on the sky side is smaller than that of the circle on the ground side, so that the connecting piece fixed on the hook plate 80 can enter from a portion of the hook hole 11 corresponding to the cross-section of the circular cross section on the ground side, and be hooked on the portion of the hook hole 11 corresponding to the circular cross section on the sky side.

Referring to FIGS. 4A, 5A, and 5B, in some embodiments, the adapter bracket 30 includes: a first bracket body 31 and a plurality of mounting grooves 38. The first bracket body 31 is arranged adjacent to the first edge along the first direction s, and the plurality of mounting grooves 38 are located on one side of the first bracket body 31 adjacent to the display panel 43. The display module 40 may include a plurality of magnetic bodies 50. The plurality of magnetic bodies 50 are respectively arranged within the plurality of mounting grooves 38 along the first direction s, and may absorb the wall mount bracket 60 by a magnetic force.

The wall mount bracket 60 may be made of ferromagnetic metal (such as iron, nickel, cobalt and the like) or alloy. The magnetic body 50 may be a magnet or the like. The adapter bracket may be made of non-ferromagnetic metal or non-metallic material, so as not to affect the absorbing effect of the magnetic body 50 over the wall mount bracket 60. When a plurality of magnetic bodies 50 are arranged within the mounting groove 38 at intervals along the first direction s, the plurality of magnetic bodies 50 may simultaneously form a more stable and reliable absorbing effect on the wall mount bracket 60 on one side of the backplane away from the display panel.

In FIGS. 4A, the first bracket body 31 may have a straight bar shape along the first direction s, so as to occupy less space along the second direction r. The plurality of mounting grooves 38 may be formed by crossing a plurality of reinforcing ribs. Referring to FIGS. 1 and 4A, in some embodiments, the adapter bracket 30 further includes: a plurality of first reinforcing ribs 33 and a plurality of second reinforcing ribs 34. A plurality of first reinforcing ribs 33 are located on the surface of the first bracket body 31 and extending along the first direction s, and a plurality of second reinforcing ribs 34 are located on the surface of the first bracket body 31 and extending along the second direction r. The plurality of second reinforcing ribs 34 and the plurality of first reinforcing ribs 33 are crossed and connected with each other, and form the plurality of mounting grooves 38. The first reinforcing rib 33 and the second reinforcing rib 34 crossing each other may effectively improve the strength and rigidity of the first bracket body 31.

Referring to FIG. 4A, the second surface B of the adapter bracket 30 includes ends surfaces of the plurality of second reinforcing ribs 34 on one side adjacent to the display module 40 and end surfaces of the plurality of first reinforcing ribs 33 on one side adjacent to the display module 40, where the ends surfaces of the plurality of second reinforcing ribs on one side adjacent to the display module and the end surfaces of the plurality of first reinforcing ribs on one side adjacent to the display module may be all in the same plane. The plane may form an acute angle with the surface of the backplane 10 along the second direction r, and may support the portion of the reflective sheet 44 adjacent to the first edge frame 41 on both sides so as to prevent the reflective sheet from collapsing. The middle portion of the reflective sheet 44 is supported by the surface of the backplane, and the portion of the reflective sheet adjacent to the first edge of the backplane is inclined and bent toward one side of the display panel relative to the middle portion so that a lateral reflective effect may be obtained.

The adapter bracket 30 of the present embodiment can not only achieve the effect of supporting the display module by connection with the external support structure of the display module, but also form a supporting effect over the reflective sheet inside the display module. Compared with the base adapter bracket outside the display device in the related art, the present embodiment reduces redundant structural parts and saves the cost by properly arranging the space structure by way of the adapter bracket, and is more compact in structure with less space occupied, thereby obtaining a thinner display device.

In order to determine the relative position between the adapter bracket 30 and the first edge frame 41 during assembling, referring to FIGS. 1, 4A, and 4B, in some embodiments, the adapter bracket 30 may further include a limiting block 39. The limiting block 39 is disposed on the first bracket body 31, and protrudes toward a direction approaching the first edge along the second direction r relative to the first bracket body 31. The limiting block 39 may be clamped with the first edge frame 41 so as to define the relative position of the adapter bracket 30 and the first edge frame 41. Referring to FIGS. 4A and 4B, in some embodiments, a limiting hole may be provided in the limiting block 39, and a protrusion is provided at a position of the first edge frame 41 corresponding to the limiting block 39, wherein the protrusion can be inserted within the limiting hole so as to implement fixation between them by clamping. After the assembling of the first edge frame and the backplane is completed, the adapter bracket 30 may be positioned using a position where the limiting block is clamped with the first edge frame, thereby improving assembling accuracy of the adapter bracket 30.

Referring to FIGS. 3 to 5B, in some embodiments, the adapter bracket 30 may further include: a second bracket body 32. The second bracket body 32 is connected to the first bracket body 31 and arranged adjacent to the second edge along the second direction r. The second bracket body 32 may abut with the second edge frame 42. In FIGS. 4A and 4B, the second bracket body 32 may have a straight bar shape along the second direction r, thereby forming an L shape with the first bracket body 31. The right-angled portion of the L-shaped body is at least partially attached to the right-angled corner portion of the backplane, so that it is possible to achieve the effect of supporting and protecting the corners of the backplane.

In FIG. 4B, the first surface A of the adapter bracket 30 is a flat surface, so as to forms a larger surface contact relationship with the surface of the backplane, thereby enabling that the adapter bracket 30 and the backplane are engaged more firmly. The first surface A may include a surface of the first bracket body 31 adjacent to one side of the backplane and a surface of the second bracket body 32 adjacent to one side of the backplane, which are seamlessly connected.

Referring to FIGS. 4A-5B, a hook groove 37 for hooking the wall mount bracket 60 may be provided in an end surface of the second bracket body 32 away from the first bracket body 31. In FIGS. 5A and 5B, a U-shaped bend 61 may be formed at the bottom of the wall mount bracket 60, wherein the U-shaped bend 61 may be inserted into the hook groove 37 from an end surface of the second bracket body 32 away from the first bracket body 31. In this way, in cooperation with an absorbing effect of the plurality of magnetic bodies 50 on the wall mount bracket 60, a more stable and reliable connection and support relationship can be formed between the adapter bracket 30 and the wall mount bracket 60.

In FIG. 4A, an orthographic projection of the plurality of magnetic bodies 50 on an end surface of the second bracket body 32 away from the first bracket body 31 may be at least partially overlapped with an orthographic projection of the hook groove 37 on the end surface, especially be located within the orthographic projection of the hook groove 37 on the end surface. A hooking force between the adapter bracket 30 and the wall mount bracket 60 may be kept consistent with a friction force generated based on an absorbing force of the magnetic body 50 on the wall mount bracket 60, thereby further improving the supporting effect.

In order to form the hook groove 37, a protruding structure 37a protruding toward the display panel may be formed on the second bracket body 32, and a hook groove 37 is formed within the protruding structure 37a. The protruding structure 37a is connected to a portion of the first bracket body 31 adjacent to the second bracket body through a reinforcing rib 37b, so as to improve the connection strength and rigidity between the first bracket body 31 and the second bracket body 32.

Referring to FIGS. 4A, 4B, 6 and 7, in some embodiments, the external support structure may include a bottom support seat 70, and a mounting hole group may also be provided in an end surface of the second bracket body 32 away from the first bracket body 31 (i.e., an end surface adjacent to the second edge). The mounting hole group includes at least two mounting holes 36 for connection with the bottom support seat 70. The mounting hole 36 may be fixedly connected to the bottom support seat 70 through a connecting piece (e.g. a screw or the like). In FIGS. 6 and 7, the mounting hole 36 is fixedly connected to the bottom support seat 70, so that it is possible to achieve the overall supporting effect of the bottom support seat 70 on the display module 40.

In FIG. 7, the bottom support seat 70 may include a connection portion 71 and two support portions 72. The connection portion 71 may abut with the second edge frame 42, and have a connecting structure fit with at least two mounting holes 36, such as a through hole and the like. The two support portions 72 are both fixedly connected with the connection portion 71, and the two support portions 72 may form a predetermined included angle therebetween, for example, 90 degrees or 120 degrees. For the display module 40, the left and right corners thereof may be respectively supported by the two bottom support seats 70, and the two support portions 72 are both located on one side of the connection portion 71 away from the display module 40.

Referring to FIGS. 4A, 4B, and 7, at least two mounting holes 36 may be distributed at intervals along the second direction r. The mounting holes may be threaded holes, which can be threadedly engaged with screws. The at least two mounting holes 36 may be located on the same straight line. For three or more mounting holes 36, they may also be located on different straight lines so as to form a more stable supporting surface. In FIGS. 4A, 4B, and 7, at least two mounting holes 36 are three mounting holes 36, and the connection lines between the three mounting holes 36 form an obtuse triangle. In this way, on one hand, a more stable triangular supporting effect may be formed, and the obtuse triangle in the direction perpendicular to the backplane occupies less width space, which meets the requirements of installing a thinner display module.

Since the second bracket body 32 needs to form a supporting effect on at least one of the bottom support seat 70 and the wall mount bracket 60, in order to improve the structural strength and rigidity of the second bracket body 32 itself, referring to FIG. 4A, in some embodiments, the adapter bracket 30 may further include a plurality of third reinforcing ribs 35. The plurality of third reinforcing ribs 35 are located on the surface of the second bracket body 32 and extend along the first direction s. At least part of the plurality of third reinforcing ribs 35 may be located between every two adjacent mounting holes 36 among the at least two mounting holes 36 respectively.

In order to form at least two mounting holes 36, at least two protruding structures 36a protruding toward the display panel may be formed on the second bracket body 32, and the mounting hole 36 is formed in each protruding structure 36a. The third reinforcing rib 35 may be located between two adjacent protruding structures 36a.

The above-described embodiments of the display module of the present disclosure may be applied to various display devices. Correspondingly, the present disclosure also provides a display device, including any of the foregoing embodiments of the display module. The display device may be a display, a television, or the like.

Figure 8:
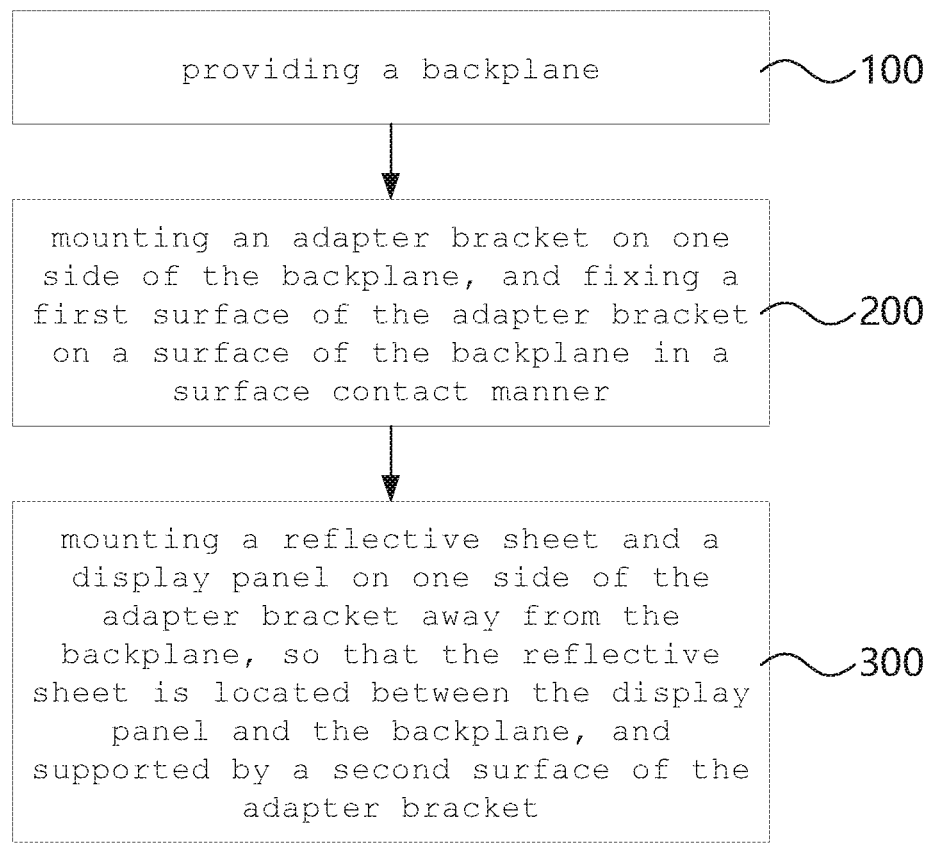
FIG. 8 is a schematic flowchart of an embodiment of an assembling method of the display module according to the present disclosure.

FIG. 8 is a schematic flowchart of an embodiment of an assembling method of the display module according to the present disclosure.

Referring to FIG. 8 and the foregoing structure of the display module, in some embodiments, the assembling method of the display module may include steps 100 to 300. In step 100, a backplane 10 is provided. In step 200, an adapter bracket 30 is mounted on one side of the backplane 10, and a first surface of the adapter bracket 30 is fixed on a surface of the backplane 10 in a surface contact manner. The adapter bracket 30 may be fixed on the surface of the backplane 10 in an adhesive manner. In step 300, reflective sheet 44 and a display panel 43 are mounted on one side of the adapter bracket 30 away from the backplane 10, so that the reflective sheet 44 is located between the display panel 43 and the backplane 10 and supported by a second surface of the adapter bracket 30. The light emitting surface of the display panel 43 is located on one side of the display panel 43 away from the adapter bracket 30.

Between step 100 and step 200, there may further include: mounting a first edge frame 41 at the first edge of the backplane 10. Correspondingly, when the adapter bracket 30 is mounted in step 200, positioning may be performed by a protruding structure 37a on the second bracket body 32. Between step 200 and step 300, a magnetic body 50, a PCB holder 46, a second edge frame 42, a light bar and an optical film layer 45 may be assembled sequentially by referring to the structure of the display module in FIG. 3.

Multiple embodiments in the present description are described in a progressive manner, with different focuses for the respective embodiments which may be subjected to cross-reference for the same or similar portions. For the embodiments of the assembling method, since the method as a whole and the steps involved are in a relationship corresponding to the content in the embodiments of the display module, such embodiments are described in a relatively simple manner. The partial descriptions of the embodiments of the system may be referred thereto for the relevant aspects.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A display module, comprising:
   a display panel;
   a backplane disposed on one side of the display panel away from a light emitting surface of the display panel;
   a reflective sheet disposed between the display panel and the backplane; and
   an adapter bracket disposed between the sheet and the backplane, and configured to connect with an external support structure located outside the display module,
   wherein the adapter bracket has a first surface and a second surface, the first surface is provided on a surface of the backplane adjacent to the display panel in a surface contact manner, and the second surface supports the reflective sheet, the backplane has a first edge extending along a first direction and a second edge extending along a second direction, and the adapter bracket is located inside a corner where the first edge intersects with the second edge, and
   wherein the adapter bracket comprises:
   a first bracket body arranged adjacent to the first edge along the first direction; and
   a plurality of mounting grooves located on one side of the first bracket body adjacent to the display panel,
   wherein the display module further comprises: a plurality of magnetic bodies respectively arranged within the plurality of mounting grooves along the first direction, and configured to absorb a wall mount bracket of the external support structure on one side of the backplane away from the display panel by a magnetic force.

2. The display module according to claim 1, wherein the adapter bracket further comprises:
   a plurality of first reinforcing ribs located on a surface of the first bracket body and extending along the first direction; and
   a plurality of second reinforcing ribs located on a surface of the first bracket body and extending along the second direction,
   wherein the plurality of second reinforcing ribs and the plurality of first reinforcing ribs are crossed and connected with each other, and form the plurality of mounting grooves, and the second surface comprises end surfaces of the plurality of second reinforcing ribs on one side adjacent to the display module and end surfaces of the plurality of first reinforcing ribs on one side adjacent to the display module, wherein the end surfaces of the plurality of second reinforcing ribs on one side adjacent to the display module and the end surfaces of the plurality of first reinforcing ribs on one side adjacent to the display module are all located in a same plane which forms an acute angle with a surface of the backplane along the second direction.

3. The display module according to claim 1, wherein the adapter bracket further comprises:
   a second bracket body connected to the first bracket body and arranged adjacent to the second edge along the second direction,
   wherein an end surface of the second bracket body away from the first bracket body has a hook groove for hooking the wall mount bracket.

4. The display module according to claim 1, wherein the adapter bracket comprises:
   a second bracket body arranged adjacent to the second edge along the second direction,
   wherein the external support structure comprises a bottom support seat, and an end surface of the second bracket body adjacent to the second edge has at least two mounting holes for connecting with the bottom support seat, and the at least two mounting holes are arranged at intervals along the second direction.

5. The display module according to claim 4, wherein the adapter bracket further comprises:
   a plurality of third reinforcing ribs located on a surface of the second bracket body and extending along the first direction,
   wherein at least part of the plurality of third reinforcing ribs are respectively located between every two adjacent mounting holes among the at least two mounting holes.

6. The display module according to claim 5, further comprising:
   a first edge frame located at the first edge of the backplane; and
   a second edge frame located at the second edge of the backplane,
   wherein the adapter bracket further comprises:
   a plurality of first reinforcing ribs located on a surface of the first bracket body and extending along the first direction;
   a plurality of second reinforcing ribs located on a surface of the first bracket body and extending along the second direction perpendicular to the first direction; and
   a limiting block disposed on the first bracket body and protruding towards a direction approaching the first edge relative to the first bracket body along the second direction, wherein the limiting block is clamped with the first edge frame so as to define a relative position of the adapter bracket and the first edge frame,
   wherein the second bracket body is connected to the first bracket body, and an end surface of the second bracket body away from the first bracket body has a hook groove for hooking the wall mount bracket.

7. The display module according to claim 6, further comprising:
   an optical film layer located between the display panel and the reflective sheet; and
   a printed circuit board holder located between the reflective sheet and the backplane, and arranged adjacent to the second edge frame.

8. The display module according to claim 4, wherein the at least two mounting holes are three mounting holes, and connection lines between the three mounting holes form an obtuse triangle.

9. The display module according to claim 1, further comprising a first edge frame disposed at the first edge of the backplane, wherein the adapter bracket further comprises:
- a limiting block disposed on the first bracket body and protruding towards a direction approaching the first edge relative to the first bracket body along the second direction, and
- wherein the limiting block is clamped with the first edge frame so as to define a relative position of the adapter bracket and the first edge frame.

10. The display module according to claim 1, wherein the first direction is perpendicular to the second direction.

11. A display device comprising the display module according to claim 1.

12. An assembling method of a display module comprising:
- providing a backplane;
- mounting an adapter bracket on one side of the backplane, and fixing a first surface of the adapter bracket on a surface of the backplane in a surface contact manner;
- mounting a reflective sheet and a display panel on one side of the adapter bracket away from the backplane, so that the reflective sheet is located between the display panel and the backplane, and supported by a second surface of the adapter bracket, and a light emitting surface of the display panel is located on one side of the display panel away from the adapter bracket;

wherein the backplane has a first edge extending along a first direction and a second edge extending along a second direction, and the adapter bracket is located inside a corner where the first edge intersects with the second edge, and wherein the adapter bracket comprises:

a first bracket body arranged adjacent to the first edge along the first direction; and a plurality of mounting grooves located on one side of the first bracket body adjacent to the display panel, wherein the display module further comprises: a plurality of magnetic bodies respectively arranged within the plurality of mounting grooves along the first direction, and configured to absorb a wall mount bracket of an external support structure on one side of the backplane away from the display panel by a magnetic force.

* * * * *